(12) United States Patent
Bu et al.

(10) Patent No.: US 6,930,007 B2
(45) Date of Patent: Aug. 16, 2005

(54) INTEGRATION OF PRE-S/D ANNEAL SELECTIVE NITRIDE/OXIDE COMPOSITE CAP FOR IMPROVING TRANSISTOR PERFORMANCE

(75) Inventors: Haowen Bu, Plano, TX (US); Shashank Ekbote, Irving, TX (US); Rajesh Khamankar, Coppell, TX (US); Shaoping Tang, Plano, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/662,850

(22) Filed: Sep. 15, 2003

(65) Prior Publication Data

US 2005/0059228 A1 Mar. 17, 2005

(51) Int. Cl.[7] .............................................. H01L 21/336
(52) U.S. Cl. ........................ 438/289; 438/554; 438/559
(58) Field of Search ................................ 438/174, 276, 438/289, 299–308, 530, 540, 554–567, 783

(56) References Cited

U.S. PATENT DOCUMENTS

| | | | |
|---|---|---|---|
| 5,593,907 A | * | 1/1997 | Anjum et al. ................ 438/298 |
| 5,863,828 A | | 1/1999 | Snyder |
| 5,877,514 A | * | 3/1999 | Seo .............................. 257/72 |
| 5,932,487 A | | 8/1999 | Lou et al. |
| 6,010,929 A | * | 1/2000 | Chapman ..................... 438/226 |
| 6,496,416 B1 | * | 12/2002 | Look ....................... 365/185.18 |

* cited by examiner

Primary Examiner—David Nelms
Assistant Examiner—Calvin Lee
(74) Attorney, Agent, or Firm—Jacqueline J. Garner; W. James Brady, III; Frederick J. Telecky, Jr.

(57) ABSTRACT

The present invention facilitates semiconductor device operation and fabrication by providing a cap-annealing process that improves channel electron mobility without substantially degrading PMOS transistor devices. The process uses an oxide/nitride composite-cap to alter the active dopant profile across the channel regions. During an annealing process, dopants migrate out of the Si/SiO2 in a channel region thereby altering the dopant profile of the channel region. This altered profile generally improves channel mobility thereby improving transistor performance and permitting smaller density designs.

2 Claims, 14 Drawing Sheets

1100

1200

INTEGRATION OF PRE-S/D ANNEAL SELECTIVE NITRIDE/OXIDE COMPOSITE CAP FOR IMPROVING TRANSISTOR PERFORMANCE

FIELD OF THE INVENTION

The present invention relates generally to the field of semiconductor devices, and more particularly, to integration of a pre-source/drain anneal selective nitride/oxide composite cap for improving transistor performance.

BACKGROUND OF THE INVENTION

There exists a continuing need to improve semiconductor device performance and further scale semiconductor devices. A characteristic that limits scalability and device performance is electron and hole mobility, also referred to as channel mobility, throughout the channel region of transistors. As devices continue to shrink in size, the channel region for transistors continues to also shrink in size, which can limit channel mobility. One technique that may improve scaling limits and device performance is to introduce strain into the channel region, which can improve electron and hole mobility. Different types of strain, including expansive strain, uniaxial tensile strain, and compressive strain, have been introduced to channel regions of various types of transistors in order to determine their affect on electron and/or hole mobility. For some devices, types of strain improve mobility whereas other degrade mobility.

FIG. 1 is a prior art cross sectional view of an NMOS transistor 100 at a stage of fabrication wherein a compressive stress is introduced by a cap-annealing process. The transistor 100 includes a channel region 101, source and drain active regions 102 and 103, a gate oxide layer 104, sidewall spacers 105, and a polysilicon gate 106. After the active regions have been formed by implanting a suitable dopant such as arsenic, a silicon dioxide capping layer 108 is deposited over/on the transistor via a chemical vapor deposition process. Generally, the temperature of deposition should be lower than the phase transition temperature of amorphous silicon. Then, a rapid thermal anneal is performed at a relatively high temperature. The capping layer 108 is then removed and silicide regions (not shown) are typically formed on the active regions 102 and 103, and the polysilicon gate 106. A suitable silicide process is a conventional Co salicide process.

Compressive stress from the polysilicon gate 106 is enhanced by the annealing process described above and introduces tensile stress across the channel region 101. This tensile stress can improve the performance of the transistor 100 by improving hole and electron mobility in the channel region 101. The cap-annealing process described supra can show improvement for NMOS devices.

The above mechanism can improve channel mobility despite its identified limitations and drawbacks. In order to obtain further shrinkage in device dimensions, it is desirable that additional mechanisms are obtained that further improve channel mobility by using different CVD films with specified physical properties.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates further improving device performance by improving channel mobility. Failure to improve mobility can prevent and/or limit future shrinkage/scaling of devices. The present invention deposits a composite nitride cap prior to performing an activation annealing process in order to improve channel mobility, through a different physical mechanism from the strain enhanced mobility mechanism described in the prior art.

Specifically, the present invention employs a cap-annealing process that improves electron channel mobility. The process uses a nitride composite cap to alter the active dopant profile across the channel regions. During an annealing process, dopants (e.g. boron) migrate from the Si/SiO2 interface in a channel region into silicon oxide that is over the source/drain extension and source/drain area, thereby altering the dopant profile of the channel region. This altered profile generally improves channel mobility thereby improving device performance and permitting smaller density designs.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention employs a cap-annealing process that improves channel electron mobility without degrading hole mobility. The process uses a nitride composite cap to alter the active dopant profile across the channel regions in NMOS transistors.

Figure 1:
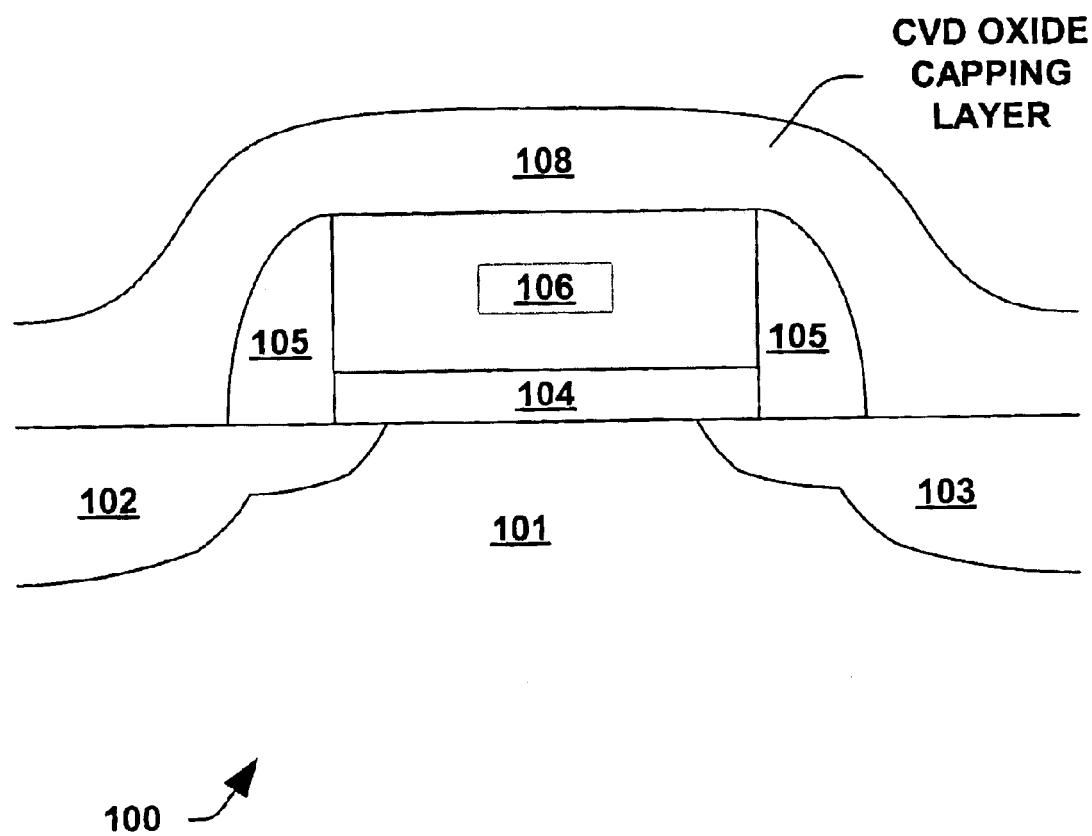
FIG. 1 is a prior art cross sectional view of an NMOS transistor wherein a tensile stress is introduced with an oxide cap annealing process.
Figure 2:
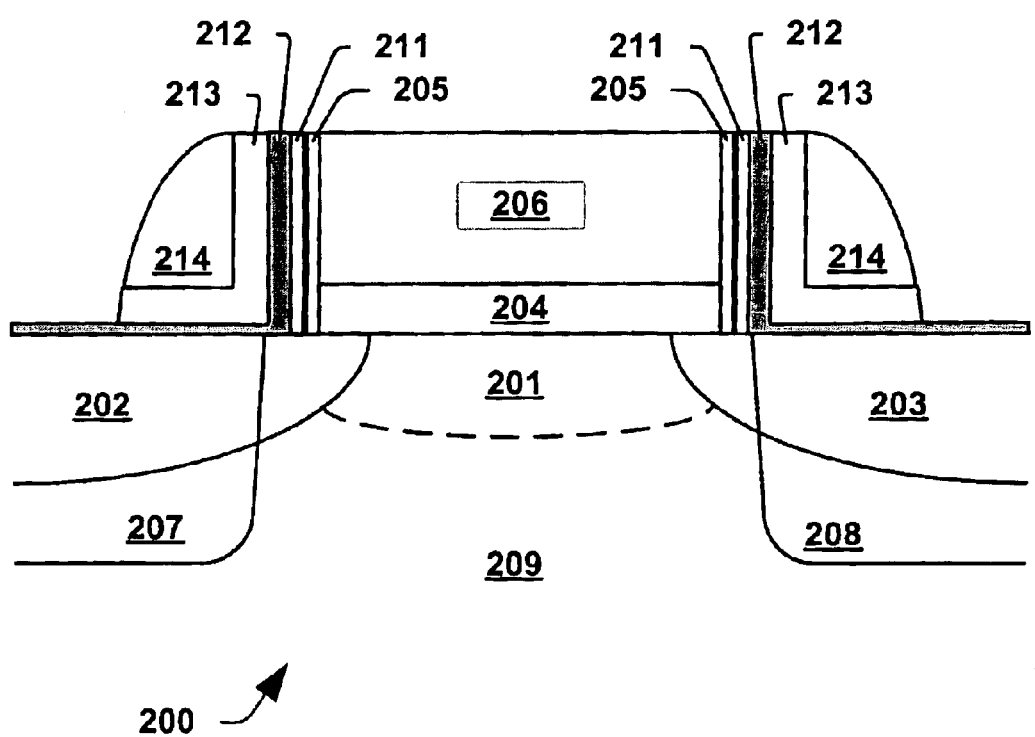
FIG. 2 is a cross sectional view of a semiconductor device in accordance with an aspect of the present invention.

Beginning with FIG. 2, a cross sectional view of a semiconductor device 200 in accordance with an aspect of the present invention is provided. The device 200 is an NMOS transistor and includes a channel region 201, active regions 202,203 (source/drain extension) and 207, 208 (source/drain), a gate oxide layer 204, a poly oxide 205, a polysilicon gate 206, an optional thin offset spacer 211, a L-shaped spacer structure (oxide 212, nitride 213 and oxide 214). The device 200 can be scaled to relatively small dimensions because the channel region 201 is fabricated so as to have an increased channel mobility compared with similar, conventional devices.

The active regions 202 and 203 are source/drain extension (SDE or LDD) regions. For NMOS transistors, they are formed by implanting an n-type dopant, such as arsenic, with a specific energy and dose into a substrate 209 to achieve a suitable depth and concentration for the active regions 202 and 203 (e.g., a dose of ~1×10$^{15}$ at 1–5 keV for arsenic). In addition, a p-type dopant, such as boron, is implanted to form the commonly known as "halo" or "pocket" to suppress the short channel effects (SCE). Typically, the dose of the "pocket" implant is lower than that of above-mentioned n-type implant (As), and the implant energy is chosen such that the "pocket" is placed deeper than the As LDD (lightly doped). Also, the implant is typically done at an angle to the surface normal. As a result, the channel is doped with boron. Since boron tends to pile up at the Si/SiO2 interface, it degrades the electron mobility at the same time that the off-state leakage current is reduced. It is highly desirable that the off-state leakage current is suppressed with minimal negative impact on the electron mobility. The channel region 201 is defined between the active regions 202 and 203.

The gate oxide layer 204 is formed on/over at least a portion of the channel region 201. A polysilicon gate 206 is formed on the gate oxide layer 204 forming a gate stack. Poly oxide 205 and a thin offset spacer 211 are formed adjacention the gate stack. 205 and 211 are optional and are used to adjust (e.g., by varying the thickness) the lateral positioning of the LDD implant to the channel (gate to drain overlap capacitance). Then, a number of sidewall spacers 212, 213, and 214 are formed adjacent to the offset region 211. The sidewall spacers 213 are L shaped silicon-nitride spacers that are formed/located on at least a portion of the active regions 202 and 203 near the gate stack. Bis-tertiary-butyl-amino-silane (BTBAS) is employed to form the silicon nitride part of the L-shaped spacers 213. Finally, a deep source/drain implant is performed, with an n-type dopant, such as As and/or P. The LDD and source/drain dopants are activated through aggressive annealing. Silicide regions (not shown) are typically formed on the active regions 202 and 203, and the polysilicon gate 206 via a suitable silicide process such as a Co or Ni salicide process.

The silicon nitride composite cap layer is deposited prior to the annealing process. During deposition of the composite nitride cap, a significant amount of hydrogen is incorporated in the film. As the anneal process occurs, the hydrogen diffuses into the channel region 201 and some dopants may diffuse out of the channel region, thereby altering the dopant profile of the channel region 201. As a result, the channel region 201 has a retrograde profile wherein the p-type concentration near a surface of the channel region is reduced. The retrograde profile can improve channel mobility through the channel region 201.

It is appreciated that the present invention includes suitable variations in structure and formation of the device 200. For example, different numbers and/or compositions of sidewall spacers can be employed and still be in accordance with the present invention. Additionally, other suitable dopants and processes can be employed and still be in accordance with the present invention.

FIGS. 3–8 are provided below to illustrate various stages of fabrication for a semiconductor device in accordance with an aspect of the present invention. The fabricated device has a channel region with an increase in channel mobility as compared to conventional devices. As a result of this increased mobility, the device current drive is improved and the device can be scaled to relatively small dimensions as compared with similar, conventional devices that lack the increased channel mobility. The stages are provided to illustrate exemplary structure and fabrication processes that can be employed in accordance with the present invention. It is appreciated that suitable variations of the structure and processes described are contemplated and in accordance with the present invention.

Figure 3:
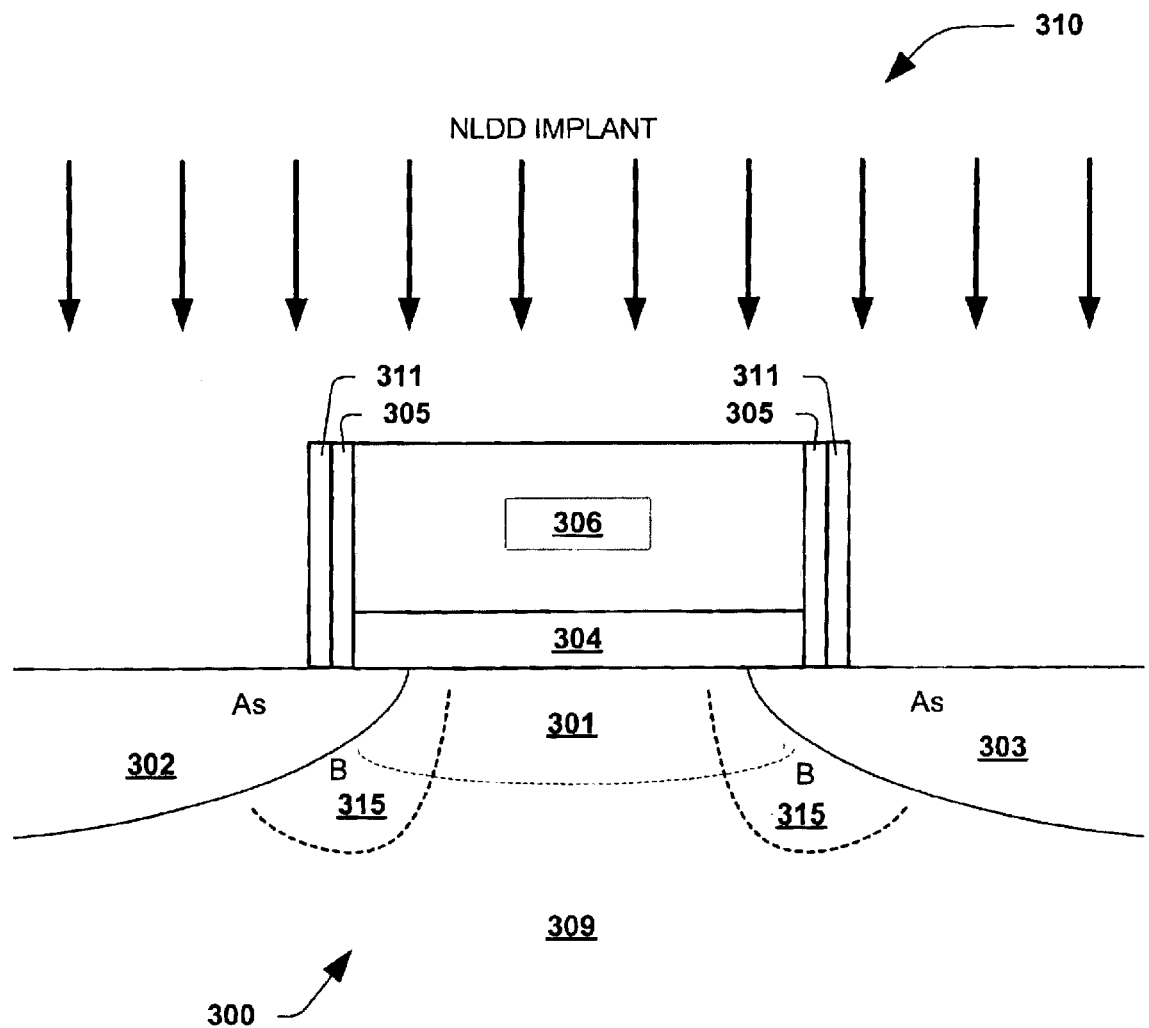
FIG. 3 is a cross sectional view of a semiconductor device undergoing a source/drain extension (SDE or LDD) implant in accordance with an aspect of the present invention.

Turning now to FIG. 3, a cross sectional view of a semiconductor device 300 undergoing a source/drain extension (SDE or LDD) implant is illustrated in accordance with an aspect of the invention. The device 300 includes a channel region 301, active regions 302 and 303, a gate oxide layer 304, a poly oxide 305, a polysilicon gate 306, and an optional thin offset spacer(s) 311, which is typically comprised of silicon nitride.

The active regions 302 and 303 are formed in a substrate 309 (e.g., a well region, an epitaxial layer, or directly into the substrate 309) by implanting an n-type dopant 310, such as arsenic, with a specific energy and dose into the substrate 309 to achieve a suitable depth and concentration for the active regions 302 and 303. Generally, the implant is performed at relatively low energy levels. In addition, a p-type dopant (such as boron) implant, usually at a higher energy and at an angle to the surface normal, is also performed.

Such an implant places the boron dopant 315 deeper than arsenic. Thus, a p-type channel region 301 is defined between the active regions 302 and 303. The gate oxide layer 304 is formed on/over at least a portion of the channel region 301. A polysilicon gate 306 is formed on the gate oxide layer 304.

Figure 4:
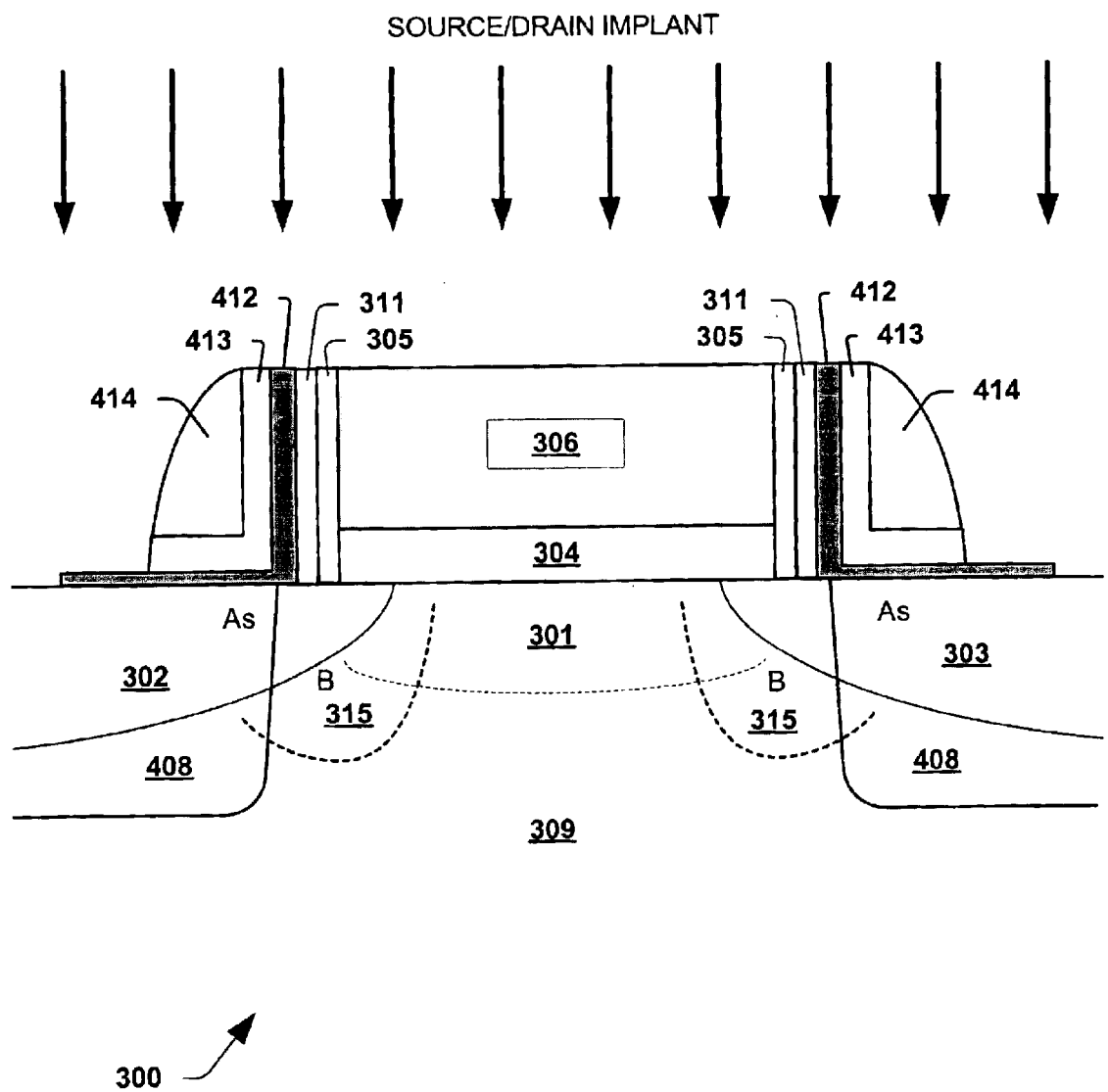
FIG. 4 is a cross sectional view of a semiconductor device undergoing a source/drain implant in accordance with an aspect of the present invention.

Continuing with FIG. 4, a cross sectional view illustrating spacer formation and source/drain implant of the semiconductor device 300 in accordance with an aspect of the present invention is depicted. Sidewall spacers 412, 413, and 414 are formed and located, adjacent to the gate oxide layer 304 and the polyslilcon gate 306. Subsequently, a source/drain implant is performed with a n-type dopant such as As and/or P, which forms deep source/drain regions 408.

Figure 5:
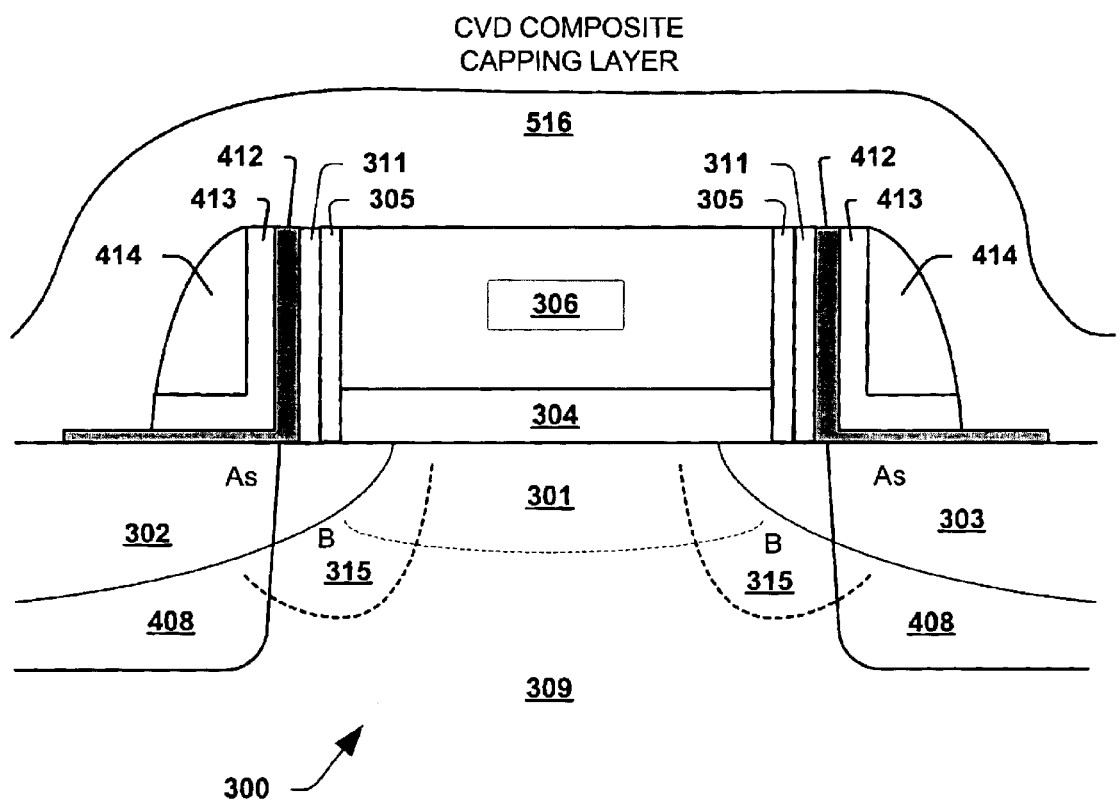
FIG. 5 is a cross sectional view of a semiconductor device after depositing a composite nitride cap in accordance with an aspect of the present invention.

Continuing with FIG. 5, a cross sectional view of the semiconductor device 300 after being covered with a nitride composite cap 516 is depicted in accordance with an aspect of the invention. The composite cap 516 is typically deposited by a low temperature chemical vapor deposition process. However, it is appreciated that other suitable processes can be employed to form/deposit the nitride composite cap layer 516. The nitride cap layer 516 comprises a relatively thin liner (not shown), typically comprised of oxide or oxynitride, and a nitride layer formed/deposited on the thin liner. An example of a suitable thickness for the thin liner is about 50 to 100 Angstroms and an example of a suitable thickness for the nitride layer is about 300 or more Angstroms. It is noted that the nitride composite cap 516 can be selectively removed from portions of the device 400 so as to not cover PMOS devices through an additional patterning step followed by combinations of wet and/or plasma etch. The benefits of this selective depositing are described further infra.

Figure 6:
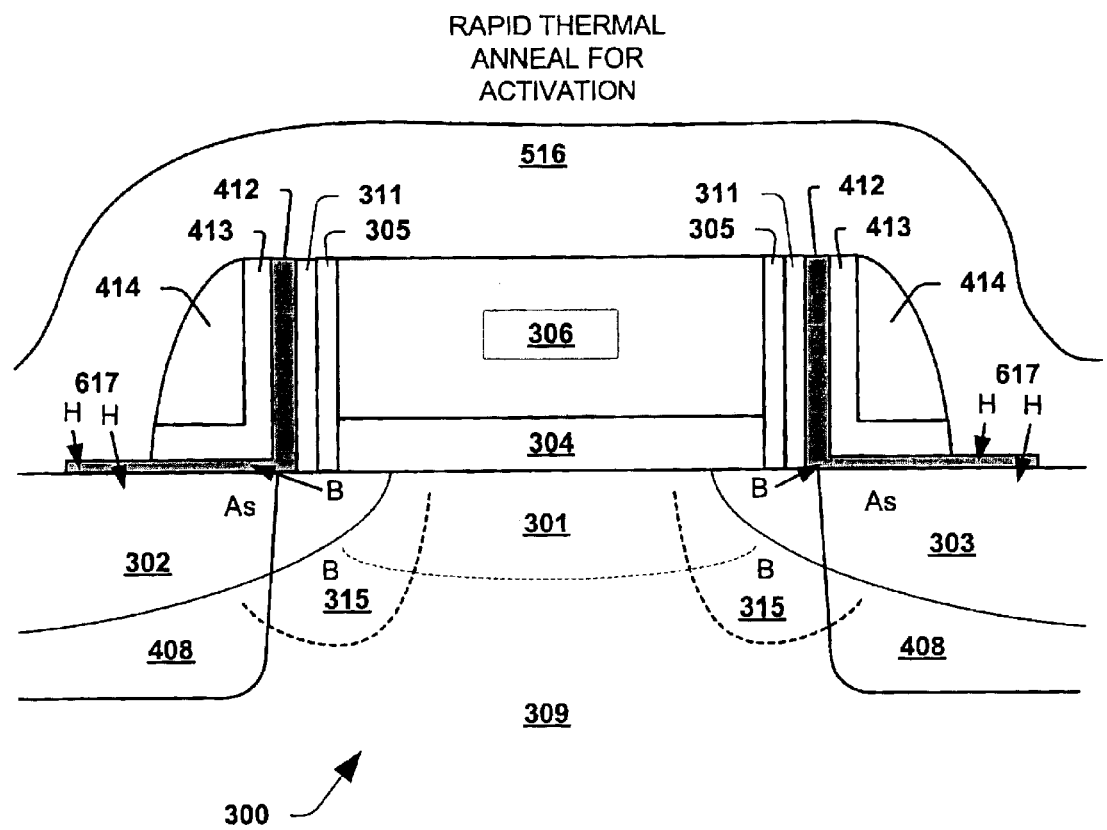
FIG. 6 is a cross sectional view of a semiconductor device undergoing a rapid thermal anneal process in accordance with an aspect of the present invention.

FIG. 6 is a cross sectional view of the semiconductor device 300 undergoing a rapid thermal anneal process in accordance with an aspect of the present invention. The rapid thermal anneal process is a rapid heating procedure that is typically performed at about 1000–1100 degrees Celsius. for less than about 5 seconds. The purpose of the anneal is to activate the dopants implanted for source/drain extension and source/drain, and to cure crystal damage induced by the previous active implant process.

Generally, rapid thermal anneal procedures are based on the principle of radiation heating. The semiconductor device (wafer) is placed in a chamber fitted with gas inlets and exhaust outlets. Inside the chamber, a heat source provides the rapid heating for a short period of time. Heat sources include graphite heaters, microwave, plasma arc, tungsten halogen lamps, and the like. Because of the short period of time, the crystal damage can be annealed while the implanted dopants substantially remain in their original positions without substantial diffusion thereof.

The nitride cap 516 has an abundance of hydrogen in the nitride film that can reach as high as about >20% depending on the deposition conditions. During the rapid thermal anneal, hydrogen is released from the nitride film and it is introduced into the surrounding structures, such as the sidewall oxide and the thin liner under the nitride. Because of the increased hydrogen concentration in the oxide from the hydrogen 617 in the nitride film, p-type dopant (e.g., boron) segregation from the channel region 301 to the spacer oxide 412 and/or the composite cap liner 516 is enhanced. As a result, there is a net boron dopant loss in the channel, which reduces the dopant pile up at the Si/SiO2 interface. Therefore, the hydrogen 617 modifies the dopant profile for the channel region and creates a retrograde profile (lower concentration of p dopant near the surface and/or channel/gate oxide interface), and improves the electron mobility for the channel region 301.

Because the impact on the dopant profile is directly caused by the hydrogen diffusion, it is observed that the higher the concentration of hydrogen in the cap film, the more improvement is achieved for the NMOS transistors. Therefore, CVD silicon nitride film is generally a better choice for the cap than CVD silicon oxide, because typically the former contains more hydrogen than the latter. Also, deposition condition can greatly change the hydrogen concentration in the film. For example, the hydrogen concentration greatly increases as the deposition temperature decreases.

It should also be pointed out the film that is suitable for the capping is not limited to the silicon nitride. Any film contains high concentration of hydrogen and the hydrogen is released at the anneal can work for this purpose.

At the same time when NMOS is improved, the PMOS can be degraded. This is due to the dose loss at PLDD. Since at PLDD implant, the dopant (typically boron) is typically placed much closer to the surface than the "pocket" for the NMOS, the dopant loss is more substantial. The dopant loss cause an increase in the parastic resistance in source/drain extension (SDE or LDD) and source/drain region.

To address the PMOS transistor degradation problem, the nitride cap film can be selectively removed (while it is left over the NMOS region) prior to the dopant activation anneal process. The selective removal typically involves an additional masking for patterning, followed by combinations of wet etch, and/or plasma etch sequences. With selective removal of the cap, the benefits on the NMOS are achieved without degrading the PMOS.

However, the selective removal is not the only solution appreciated by the inventors of the present invention. The dose loss problem for the PMOS can be alternatively addressed by other suitable mechanisms such as increasing the energy, and/or dose at the PLDD implant.

Figure 7:
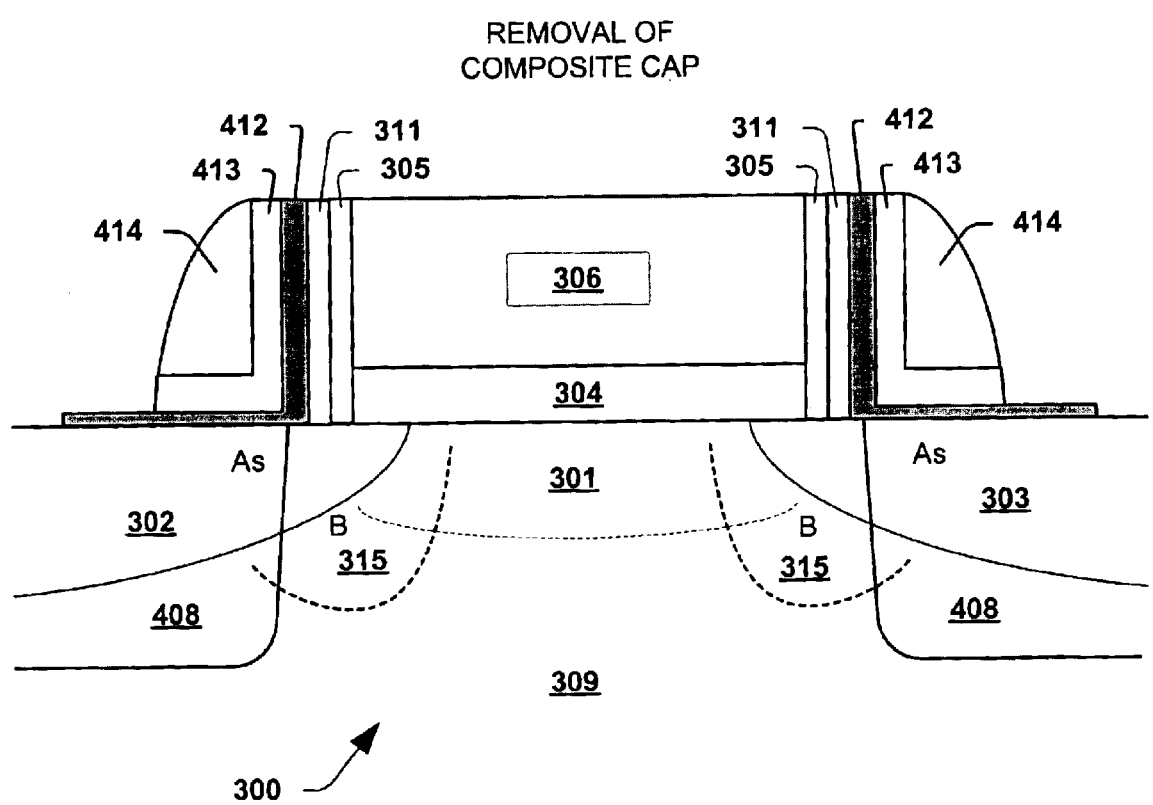
FIG. 7 is a cross sectional view of a semiconductor device subsequent to the rapid thermal anneal process in accordance with an aspect of the present invention.

Continuing with FIG. 7, another cross sectional view of the semiconductor device 300 subsequent to the rapid thermal anneal process in accordance with an aspect of the present invention is shown. Here, the composite cap layer 516 has been removed by etching the layer 516 from the device 300 via a blanket wet etch, although other suitable etching mechanisms can be employed. The thin oxide (or oxynitride) liner at the botton of the cap provide an extra protection of the Si substrate from the attack of etchant such as phosphoric acid. Depending on the integration scheme, the thin liner may not be needed under the thick silicon nitride layer if there is already silicon oxide covering the gate stack and other active areas prior to the cap deposition. Generally, there is a large difference in the wet etch rate between the nitride cap and oxide. In addition, the wet etch rate between the nitride cap and the BTBAS nitride (used for L-shaped sidewall spacer 413) is also quite large after annealing. Therefore, the blanket wet etch is highly selective such that the nitride cap is removed without affecting the gate stack, sidewall spacer and other active areas. At this point of fabrication (after the anneal and the cap removal), the channel mobility for the channel region 301 has been improved due to the retrograde profile.

Figure 8:
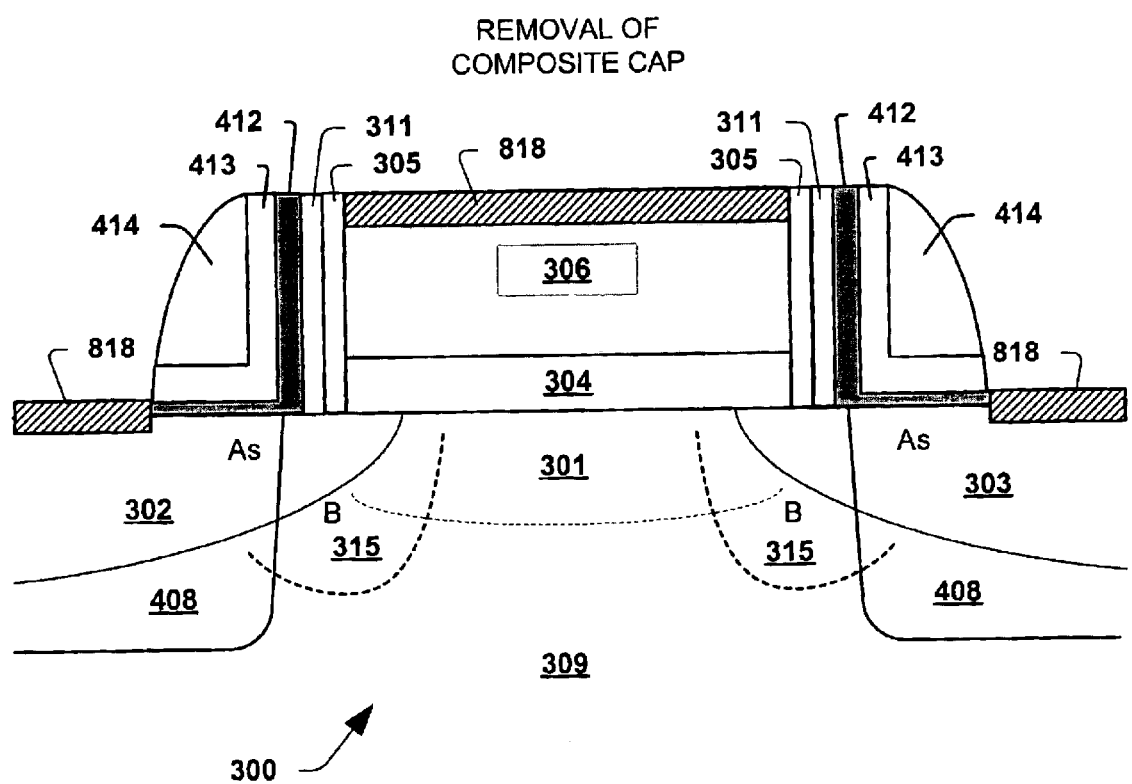
FIG. 8 is a cross sectional view illustrating a semiconductor device after silicide region formation in accordance with an aspect of the present invention.

FIG. 8 is yet another cross sectional view illustrating the semiconductor device 300 after silicide region formation in accordance with an aspect of the present invention. The formation of suicide begins after the nitride cap is removed.

Silicide regions 818 are formed on the active regions 402 and 403, and on the polysilicon gate 306. A salicide process in which a refractory metal, such as cobalt or nickel, is deposited on the regions 818, is performed and the refractory metal reacts with the underlying polysilicon or silicon layer by an allow step forming silicide. Unreacted refractory metal is then removed from the surface of the device 300. The silicide regions 818 provide low resistance contacts for metal/conductive interconnects to be formed later.

Figure 9:
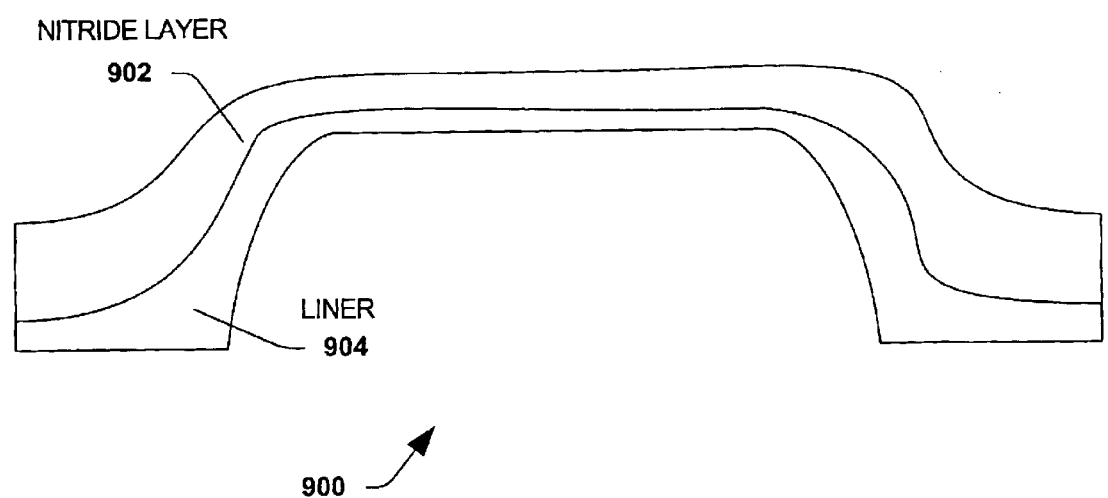
FIG. 9 is a cross sectional view illustrating an exemplary composite nitride cap in accordance with an aspect of the present invention.

FIG. 9 is a cross sectional view illustrating an exemplary composite nitride cap 900 in accordance with an aspect of the present invention. The composite nitride cap 900 includes an upper nitride layer 902 and a lower, oxide liner 904. The cap 900 can be selectively employed after implantation and prior to an annealing operation in order to improve electron mobility within an NMOS channel region of a semiconductor device while causing no substantial degradation to the PMOS transistors.

In order to effectively alter the dopant profiles, the film should have a large quantity of hydrogen in the cap film. This is different from the prior art that in the prior art, the tensile stress in the cap film is critical to introduce tensile stress in the channel. To enable the changes in dopant profiles, the intrinsic film stress is not critical, however, the hydrogen concentration should be greater than about atomic 15%. Some exemplary suitable processes that can be employed to form the cap 900 are a 500 degree celsius rapid thermal chemical vapor deposition (RTCVD) process and a 300 to 350 degree celsius plasma enhanced chemical vapor deposition (PECVD) process.

The cap 900 is illustrated with the upper layer 902 comprised of nitride and the liner 904 comprised of oxide. An exemplary suitable thickness for the upper layer 902 is about 800 Angstroms and an exemplary suitable thickness for the liner 904 is about 50 to 100 Angstroms. In variations according to the present invention, the cap 900 is comprised solely of a nitride layer having a thickness of about 800 Angstroms and another wherein the upper layer 902 is comprised of oxide instead of nitride and the liner 904 is comprised of nitride with a thickness of about 40 to 100 Angstroms.

It is appreciated that other suitable thicknesses, materials, and layer arrangements can be employed for the upper layer 902 and the liner 904 that facilitate increased electron and/or hole mobility within the channel region.

While, for purposes of simplicity of explanation, the methodologies described infra are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect of the present invention.

Figure 10:
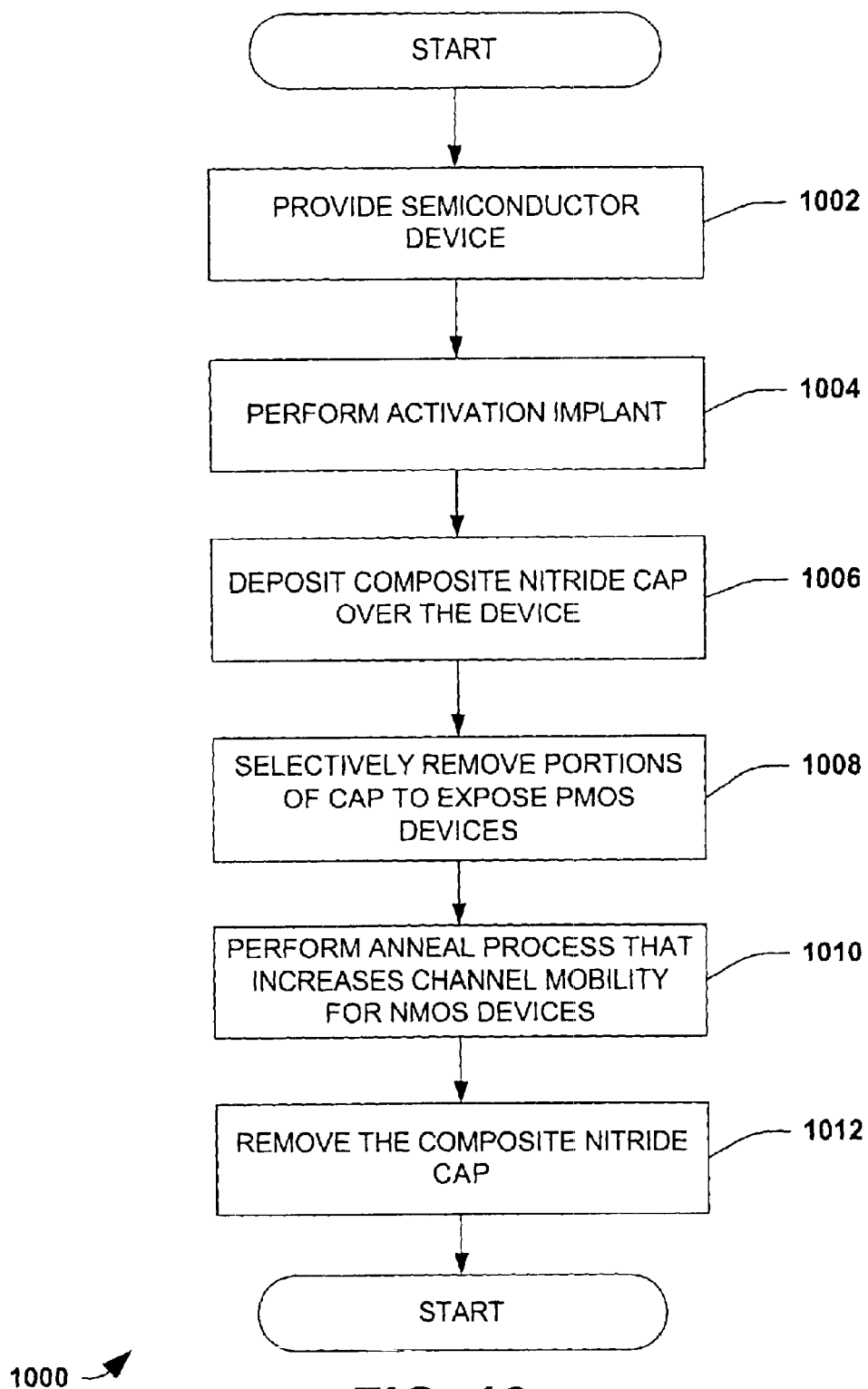
FIG. 10 is a flow diagram illustrating a method of fabricating a semiconductor device having increased channel mobility in accordance with an aspect of the present invention.

FIG. 10 is a flow diagram illustrating a method 1000 of fabricating a semiconductor device having increased channel mobility in accordance with an aspect of the present invention. To further appreciate the method 1000, please refer to FIGS. 3–9, described supra.

The method 1000 begins at block 1002 where a semiconductor device comprising active regions, a polysilicon gate, L-shaped nitride spacers adjacent to the polysilicon gate, and sidewalls on the L-shaped nitride spacers is provided. Generally the device is provided by performing the following and/or variations thereof. A gate oxide layer is formed on a semiconductor substrate. A polysilicon layer is formed on the gate oxide layer. Then, the gate oxide layer and the polysilicon layer are patterned thereby defining a polysilicon gate. L-shaped nitride spacers are formed adjacent to the polysilicon gate and sidewalls, comprised of oxide, are formed on/over the nitride spacers.

An active region (source/drain) implant is performed at block 1004 by implanting a dopant into the active regions. Following the active region implant, a composite nitride cap is formed over the semiconductor device at block 1006. A suitable deposition process is employed such as a 500 degree celsius rapid thermal chemical vapor deposition (RTCVD) process, a 300 to 350 degree celsius plasma enhanced chemical vapor deposition (PECVD) process, and the like.

In some instances and/or conditions, presence of the cap on PMOS devices can degrade some aspects of the PMOS devices due to dopant loss. As a result, portions of the composite nitride cap are selectively removed at block 1008 thereby exposing PMOS devices while leaving the cap covering NMOS devices. However, the present invention contemplates methods wherein the cap remains on NMOS devices.

An annealing process is then performed on the device that alters an active profile of the channel region at block 1010. Generally, the annealing process performed is a rapid thermal anneal previously described supra. Subsequently, the nitride composite cap is substantially removed at block 1012. Typically, a wet etch process is employed that takes advantage of differing etch rates for the composite cap and spacers. Other processing steps such as, but not limited to, forming silicide regions, metallization, and the like can be performed to complete fabrication of the semiconductor device.

Figure 11:
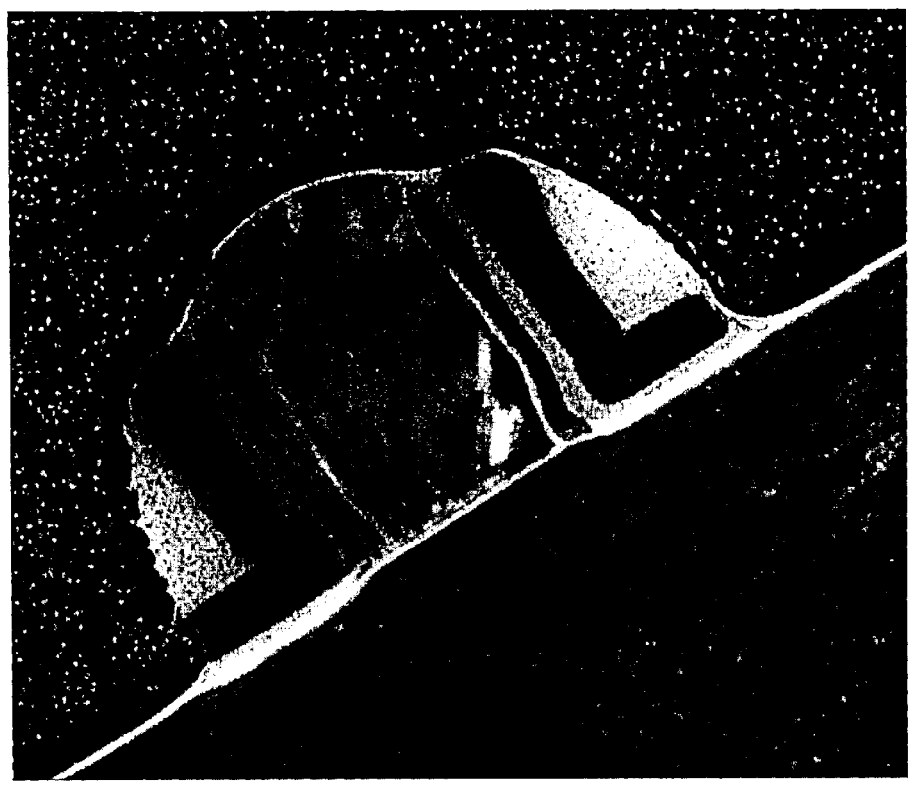
FIG. 11 is an TEM photo depicting an NMOS semiconductor device in accordance with an aspect of the present invention.
Figure 12:
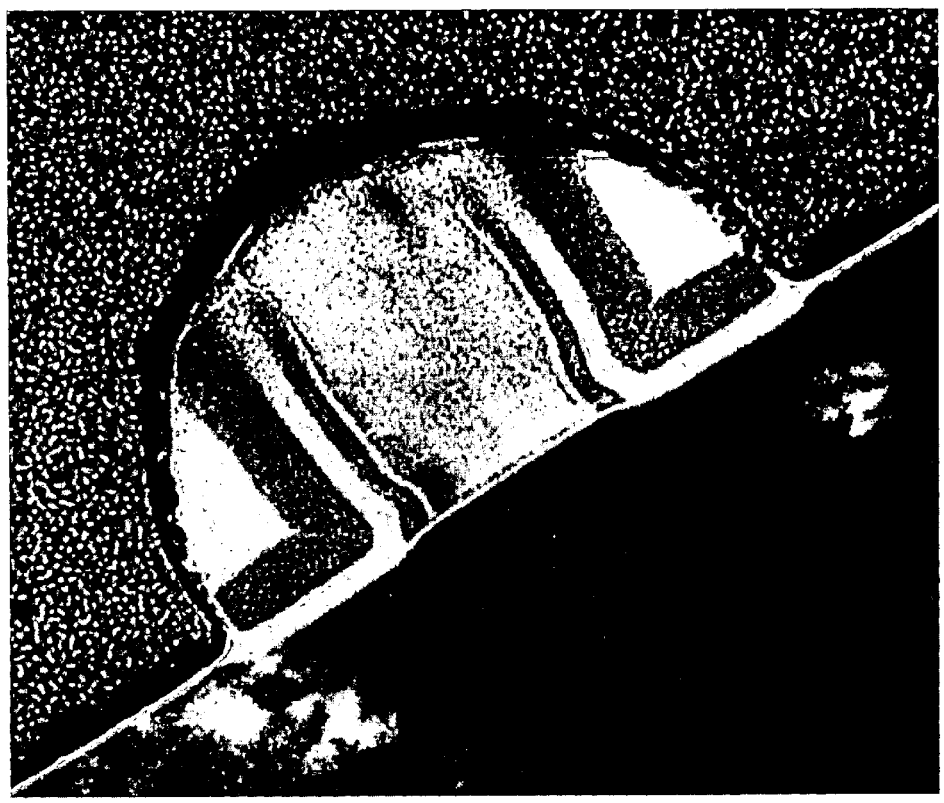
FIG. 12 is an TEM photo depicting an NMOS semiconductor device after cap deposition, SID activation anneal and cap removal in accordance with an aspect of the present invention.

FIG. 11 is a photo depicting an NMOS semiconductor device 1100 in accordance with an aspect of the present invention. The device 1100 is shown for a standard process without cap deposition and cap removal. FIG. 12 is a photo depicting an NMOS semiconductor device 1200 in accordance with an aspect of the present invention. This device 1200 is depicted after cap deposition, rapid thermal anneal, and cap removal. It can be seen that spacer structures and gate structures remain intact. In contrast to the prior art, the physical deformation of the poly-Si gate stack which was reported in the prior art and used to explain the compressive strain generated on the gate stack, was not obvious in this invention.

Figure 13:
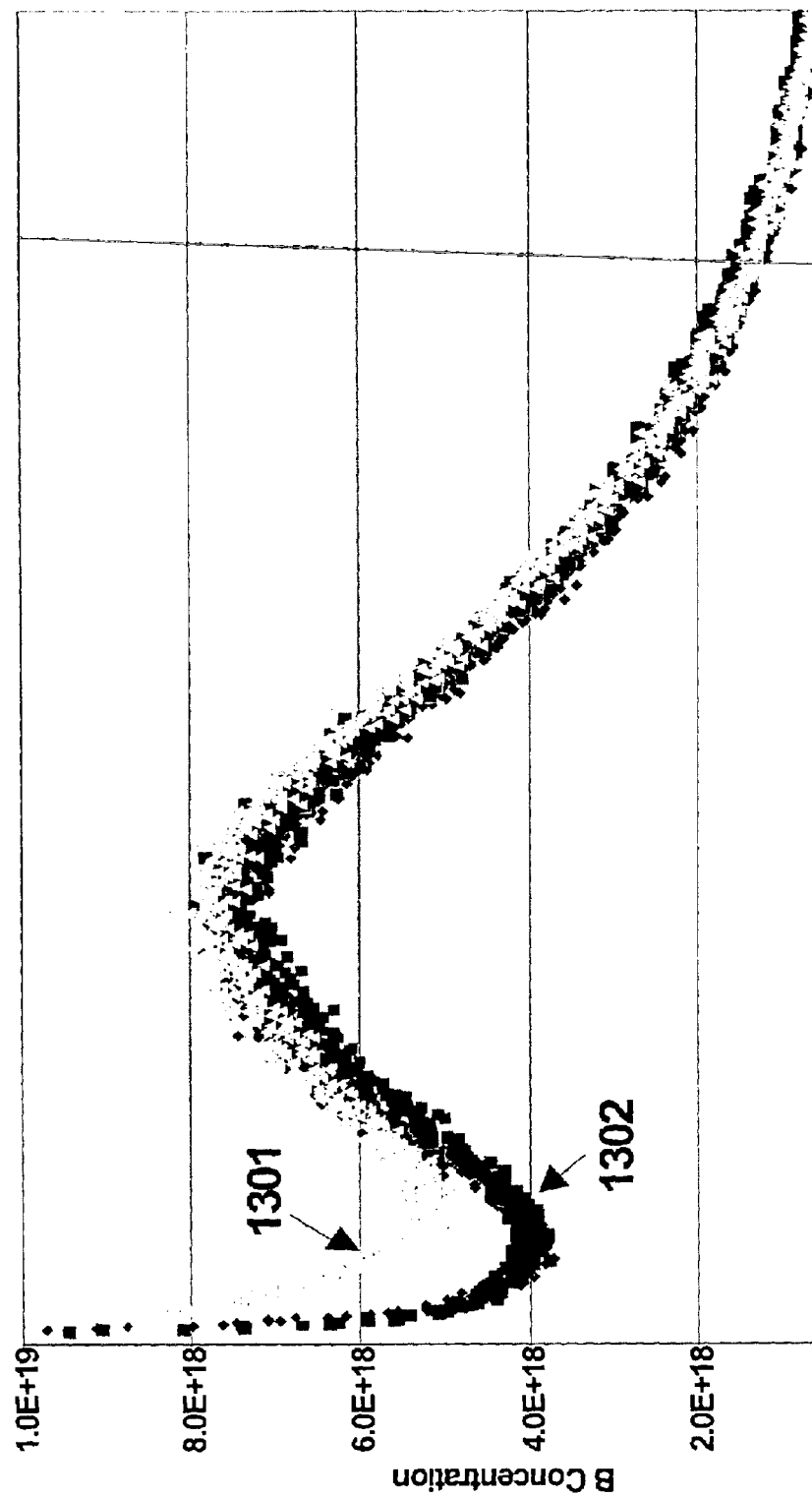
FIG. 13 is a plot illustrating and comparing exemplary experimental data (boron pocket profiles) in accordance with an aspect of the present invention.

FIG. 13 is a plot illustrating and comparing exemplary experimental data in accordance with an aspect of the present invention. The plot depicts the boron profiles in the channel region. Line 1301 depicts results of a transistor which has been fabricated without utilizing a cap prior to the anneal process. Line 1302 depicts results of a second transistor wherein a silicon nitride or nitride composite cap is employed for the annealing process. It is evident that the hydrogen enhanced boron segregation causes the formation retrograde profile.

Figure 14:
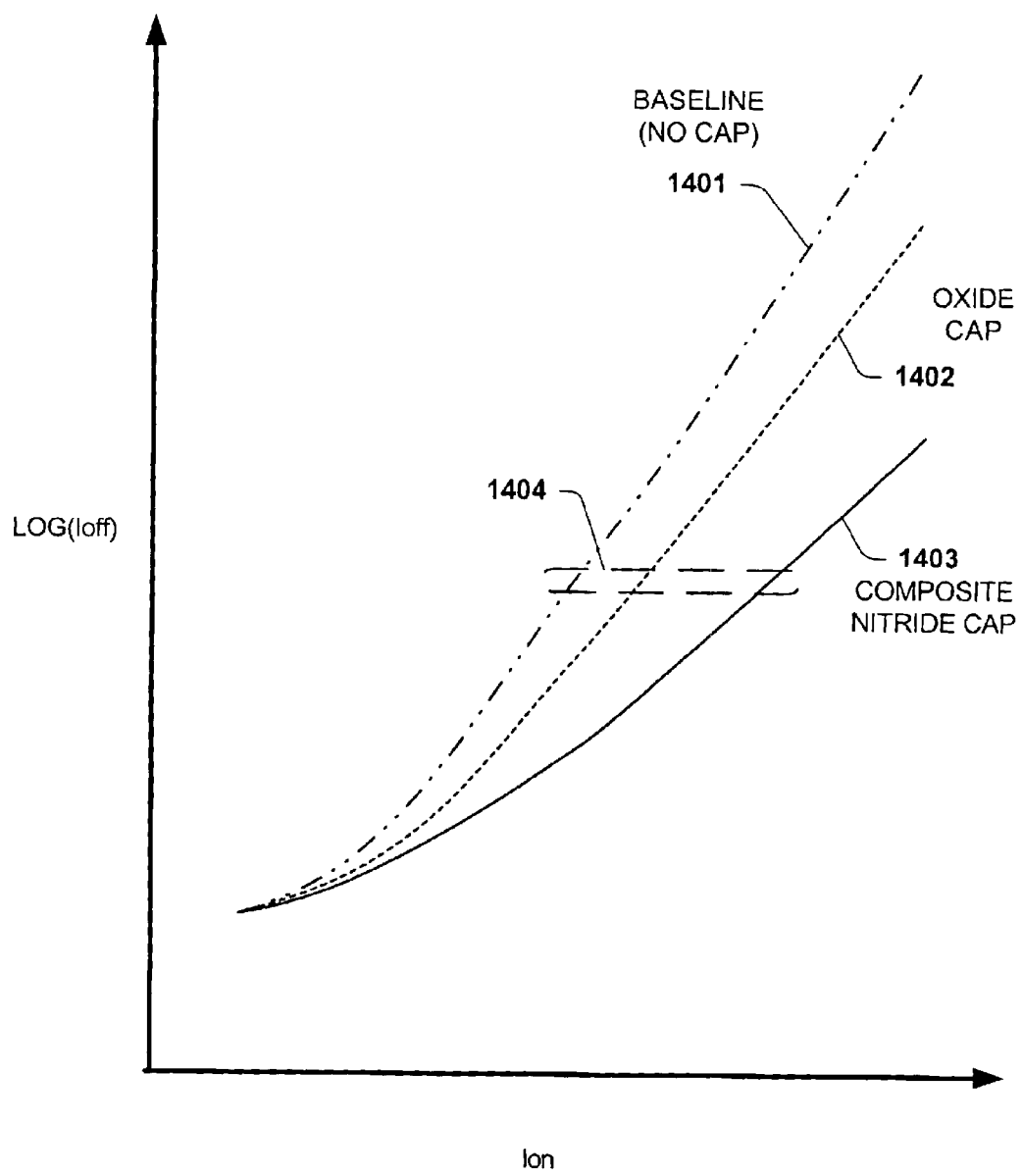
FIG. 14 is a plot illustrating and comparing exemplary experimental data in accordance with an aspect of the present invention.

FIG. 14 is a plot illustrating and comparing exemplary experimental data in accordance with an aspect of the present invention. The plot depicts the current drive for NMOS transistors with the transistor(s) on ($I_{on}$) versus channel current with the transistor(s) off ($I_{off}$), referred to as leakage current. The x-axis shows the $I_{on}$ while the y-axis shows a log of $I_{off}$. Line 1401 depicts results of a transistor which has been fabricated without utilizing a cap for an anneal process, line 1402 depicts results of a second transistor wherein a silicon oxide cap is employed for the annealing process, and line 1403 depicts results of a third transistor wherein a silicon nitride or nitride composite cap is employed for the annealing process. The difference is most likely caused by the difference of hydrogen concentration in the cap film, as discussed earlier. In general, oxide film does not have sufficiently high enough hydrogen to form the retrograde profile for enhancing the channel mobility.

The composite cap for the third transistor is fabricated by a PECVD or RTCVD nitride deposition process with SiH4 and NH3 at less than about 500 degrees Celsius. However, it is appreciated that the present invention can employ other suitable mechanisms and/or process conditions for depositing the composite nitride cap. The oxide cap for the second transistor is formed by a RTCVD oxide process at less than about 500 degrees Celsius. An upper nitride layer of the nitride composite cap is about 30 to 120 nm and the liner is about 5 to 10 nm for this example. The oxide cap has a thickness of about 30 to 130 nm.

From the plot, it can be seen that the oxide cap provides slightly higher channel current compared to the baseline and that the composite nitride cap provides superior channel current compared to the oxide cap and the baseline. Thus, for a given amount of leakage current, the composite nitride cap provides better channel current in this example 1404. Generally, experimental data has shown about a 10–25 percent improvement in channel current for the composite nitride cap versus the no cap or oxide cap.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a composite nitride cap comprising:

providing an NMOS semiconductor device having active regions, a channel region and a polysilicon gate;

forming a liner layer over at least a portion of the semiconductor device;

forming an upper layer on the liner layer wherein the upper layer is substantially thicker than the liner layer and is comprised substantially of nitride; and causing dopants to segregate out of an Si/SiO2 interface in the channel region during an annealing process.

2. A method of fabricating a composite nitride cap comprising:

providing an NMOS semiconductor device having active regions, a channel region and a polysilicon gate;

forming a liner layer over at least a portion of the semiconductor device; and forming an upper layer on the liner layer wherein the upper layer is substantially thicker than the liner layer and is comprised substantially of nitride, wherein said upper layer further comprises a hydrogen concentration creator than about atomic 15%.

* * * * *